United States Patent [19]

Klank

[11] 4,177,428
[45] Dec. 4, 1979

[54] CIRCUIT ARRANGEMENT FOR AMPLIFYING OSCILLATOR OSCILLATIONS AND CONVERTING SAME TO RECTANGULAR SIGNALS

[75] Inventor: Otto Klank, Arpke, Fed. Rep. of Germany

[73] Assignee: Licentia Patent-Verwaltung-G.m.b.H., Frankfurt, Fed. Rep. of Germany

[21] Appl. No.: 834,448

[22] Filed: Sep. 19, 1977

[30] Foreign Application Priority Data

Sep. 17, 1977 [DE] Fed. Rep. of Germany ....... 2641782

[51] Int. Cl.² .............................................. H04B 1/06
[52] U.S. Cl. .................................... 325/455; 325/317; 331/64; 330/296
[58] Field of Search ............... 325/455, 315, 316, 317, 325/457, 363, 364; 331/64, 49; 329/126, 128; 330/22, 24, 25, 26, 177, 180

[56] References Cited

U.S. PATENT DOCUMENTS

| | | | |
|---|---|---|---|
| 3,806,811 | 4/1974 | Thompson | 325/363 |
| 3,949,307 | 4/1976 | Klank et al. | 325/455 |

*Primary Examiner*—Robert L. Richardson
*Assistant Examiner*—Tommy P. Chin

*Attorney, Agent, or Firm*—Spencer & Kaye

[57] ABSTRACT

A circuit arrangement for digitally indicating the frequency to which an AM/FM radio receiver is tuned in which the oscillations of the AM and FM oscillators are amplified and converted to rectangular oscillations whose frequency is counted by means of electronic counters and then digitally displayed. The oscillations of the AM oscillator and the oscillations of the FM oscillator are amplified and converted to rectangular signals by means of a common broadband amplifier which has a sufficiently broad bandwidth so that the oscillator frequencies for the AM range as well as those for the FM range are both passed and amplified, and the coupling of the input of the broadband amplifier to the outputs of the tuning oscillators is so loose that the tuning oscillators are not noticeably detuned by changes in capacitance of the broadband amplifier. The common broadband amplifier includes two inverters which are each designed as an integrated circuit, and have a fast rise-time. The two inverters are connected in series with one another via a capacitance and each inverter is biased at its input with a biasing voltage so that its operating point lies on the steep portion of the curve indicating the relationship between the input voltage and the output voltage of the inverter.

9 Claims, 3 Drawing Figures

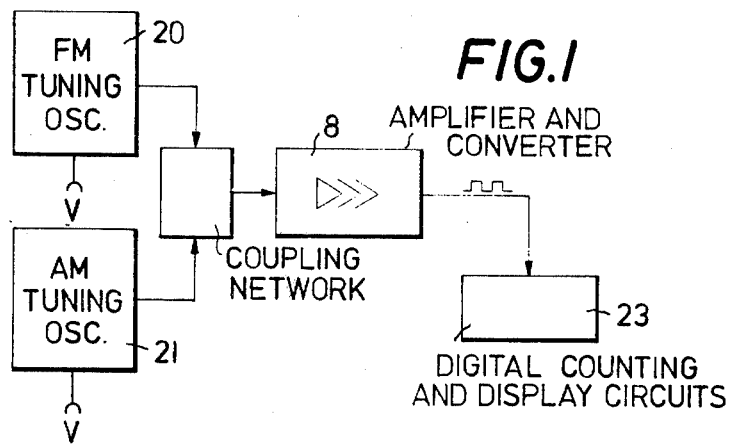
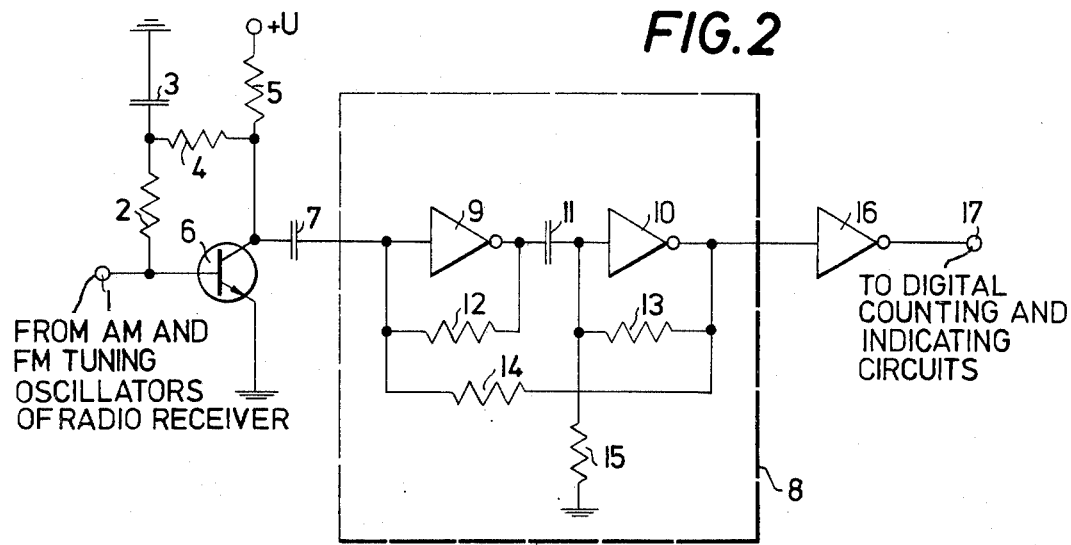
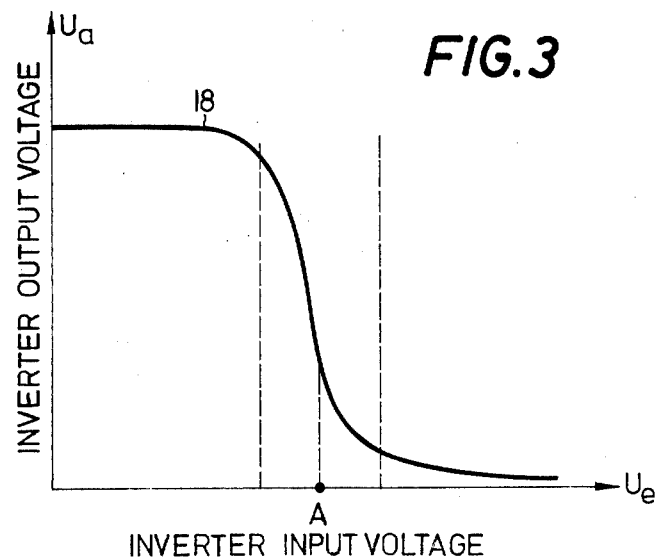

CIRCUIT ARRANGEMENT FOR AMPLIFYING OSCILLATOR OSCILLATIONS AND CONVERTING SAME TO RECTANGULAR SIGNALS

BACKGROUND OF THE INVENTION

The present invention relates to an improved circuit arrangement for the digital indicator of the received frequency of a radio receiver operating in both the AM and FM frequency ranges.

U.S. Pat. No. 3,949,307, issued Apr. 6, 1976, the subject matter of which is incorporated herein by reference discloses a circuit arrangement for digital frequency indication in an AM/FM radio receiver in which circuit arrangement the oscillations of the AM and FM tuning oscillators are amplified and converted to rectangular oscillations or signals whose frequency is counted by means of electronic counters and then digitally displayed. Since the respective signals obtained from the FM oscillator or from the AM oscillator are too weak to actuate the counting circuits, it is necessary to amplify them. The amplified oscillations or output signals of the respective oscillators are additionally converted to rectangular signals of the same fundamental frequency which are suitable to actuate the digital counting circuits.

In the above-identified United States patent, the oscillations of the AM oscillator and those of the FM oscillator are amplified by means of a common broadband amplifier which has a sufficiently broad bandwidth that the oscillator oscillations for the AM range as well as those for the FM range are covered. The couplings of the broadband amplifier to the oscillators are dimensioned so loosely that the oscillators will not noticeably be detuned by changes in capacitance of the broadband amplifier.

It has been found, however, that the expenditures for the common broadband amplifier to amplify and rectangularize the oscillations are relatively high.

SUMMARY OF THE INVENTION

It is therefore the object of the present invention to provide a less complicated broadband amplifier which is easier to manufacture and less expensive.

This problem is solved by the present invention in that in a circuit arrangement for digitally indicating the frequency to which an AM/FM radio receiver is tuned wherein the output signals of the AM and FM tuning oscillators are coupled to the input of a common broadband amplifier which has a bandwidth sufficiently broad so as to pass and amplify the signal frequencies from both the AM tuning oscillator and the FM tuning oscillator and which converts said amplified output signals from the tuning oscillators into rectangular signals, wherein the frequency of rectangular output signals from the common broadband amplifier are counted by electronic digital counters and digitally displayed, and wherein the coupling of the broadband amplifier to the tuning oscillators is so loose that the oscillators are not noticeably detuned by changes in capacitance of the broadband amplifier; the common broadband amplifier comprises two inverters each having a fast rise time, which are each designed as an integrated circuit and which are connected in series with one another via a capacitance, and means for applying respective bias voltages to the input of each of said inverters so that the operating point of each inverter lies on the steep portion of the curve indicating the relationship between the input voltage and the output voltage of the inverter.

In the present invention, inverters which are each designed as an integrated circuit are used in place of the transistors in discrete circuits of the amplifier of the above-identified patent. Conventionally, a plurality of inverters are combined into a single commercially available integrated circuit (IC) which is a relatively economical acquisition. The inverters are biased at their inputs such that the operating point of each inverter lies on the steep portion of a curve which indicates the relationship between the input voltage and the output voltage of the inverter and describes its behavior. The inverters, which by themselves constitute a threshold value amplifier with phase reversal, in the present invention operate practically as RC coupled amplifiers and simultaneously effect ideal conversion of the output signals from the tuning oscillators into the rectangular signals used to actuate the subsequent digital counting circuits. Since the inverters themselves constitute a digital circuit, coupling and matching of the broadband amplifier to the subsequent digital counting circuit is entirely without problems.

It is known (e.g., see "DAS TTL Kochbuch" by Texas Instruments Deutschland GmbH, page 111, FIG. 5.47) to connect two digital inverters in series via a capacitance and to produce a bias at their inputs by means of feedback resistors, for the purpose of providing an oscillator circuit for rectangular oscillations. In contradistinction thereto the present invention provides a broadband amplifier composed of inverters for the oscillations of the AM and FM oscillators of a radio receiver. Such a broadband amplifier is not known in the art.

BRIEF DESCRIPTION OF THE DRAWINGS

FIG. 1 is a basic block diagram showing the frequency indicating circuit arrangement according to the invention as disclosed in the above-identified U.S. Pat. No. 3,949,307.

FIG. 2 is a schematic circuit diagram of a preferred embodiment of a broadband amplifier according to the invention.

FIG. 3 is a graphic representation of the relationships between the output voltage and the input voltage of an inverter used in the amplifier according to the invention.

DETAILED DESCRIPTION OF THE PREFERRED EMBODIMENTS

Referring now to FIG. 1 there are shown the FM tuning oscillator 20 and the AM tuning oscillator 21 of a radio receiver which itself is not shown. Depending on the frequency range of the received wave, only the FM oscillator 20 or only the AM oscillator 21 is in operation in that only the tuning oscillator which is presently required receives a supply voltage V. Coupled to the outputs of the oscillators 1 and 3 via a coupling network 22 is a broadband amplifier 8. The coupling network 22 sufficiently loosely couples the outputs of the oscillator 20 and 21 to the input of the broadband amplifier 8 so that the tuning oscillators are not noticeably detuned by changes in capacity in the broadband amplifier.

During tuning the AM oscillator 21 sweeps a frequency range from about 0.5 to 25 MHz, while the frequency range, during tuning of the FM oscillator 20 extends from about 100 to about 120 MHz. The broadband amplifier 8, which is common for both oscillators 20 and 21, must therefore have a bandwidth from 0.5 to 120 MHz so that it can amplify signals from both of the oscillators. In order to keep the load on the oscillators 20 and 21 low, and to realize sufficient coupling, the gain for the broadband amplifier 8 is selected to be high, for example, a 1000-fold amplification.

The broadband amplifier 8 amplifies the oscillations from the respective oscillators 20 or 21 and simultaneously converts these oscillations into the rectangular oscillations required for the subsequent digital counting and display circuits 23. The digital circuits 23 as well as the coupling network 22 are more fully described in the above-identified U.S. Pat. No. 3,949,307.

Referring now to FIG. 2, the oscillations from either the FM oscillator 20 or the AM oscillator 21 of the radio receiver (not shown in this figure) reach the input terminal 1 of an HF amplifier stage. The HF amplifier stage comprises, for example, an npn transistor 6, an operating resistor 5, two further resistors 2 and 4 connected in series between the collector and base of the transistor 6, and a capacitor 3 connected between the common junction of resistors 2 and 4 and a point of reference potential, e.g., ground. A positive operating voltage is present at a terminal +U connected to the resistor 5 while the emitter of the transistor 6 is connected to the point of reference potential. The preamplified oscillations travel from the collector of transistor 6 via a capacitor 7 to a broadband amplifier 8. If necessary, the above-mentioned HF amplifier stage can be eliminated so that the oscillations of the FM oscillator or of the AM oscillator are brought directly to the broadband amplifier 8. Whether the HF amplifier stage is necessary or not depends on the level of the oscillations produced by the FM oscillator or by the AM oscillator in each individual case. The HF amplifier stage as well as the amplifier 8 must have a sufficiently broad bandwidth so that the frequencies of both the AM and FM tuning oscillators will be passed and amplified.

The broadband amplifier 8 includes two inverters 9 and 10 which are connected in series via a capacitance 11. Due to the desired broadbandedness, the two inverters 9 and 10 have a fast rise time. The use of so-called Schottky inverters is particularly advantageous. Inverters 9 and 10 are designed as integrated circuit as it is available, for example, in IC 74S04 (Texas Instruments). Since one such IC contains more than two inverters, it is easy to connect a third inverter 16 to the output of the second inverter 10 to produce an improvement in signal shaping so that rectangular signals are available at output terminal 17 with which the subsequent counting circuits (not shown) can be actuated ideally. The frequency of the rectangular oscillations appearing at output terminal 17 is equal to the frequency of the oscillations fed to broadband amplifier 8.

The output of the first inverter 9 is connected with its input via a feedback resistor 12. Thus inverter 9 is provided with a bias voltage at its input. The input of the second inverter 10 is likewise biased with a voltage which is obtained from the tap of a voltage divider 13, 15 connected between the output of the second inverter 10 and the point of reference potential, e.g., ground.

For better understanding of the operation of the inverters 9 and 10, FIG. 3 is a diagram which shows the relationship between the output voltage Ua and the input voltage Ue of an inverter of the type used in the present invention. Curve 18 indicates clearly that the output voltage Ua remains initially at a relatively high level if the input voltage value Ue is low and that with increasing input voltage Ue the output voltage Ua quickly drops to a lower value. In the transition zone indicated by the dashed lines, curve 18 is relatively steep. The above-mentioned biasing voltages are dimensioned so as to operate the two inverters 9 and 10 at the illustrated operating point A in the steep portion of curve 18. Due to the feedback resistor 12 or the voltage divider 13, 15, respectively, the inverters 9, 10 operate practically as RC coupled amplifiers through which the input signals are amplified as well as converted to rectangular oscillations.

According to an advantageous feature of the invention, as shown in FIG. 1, via an ohmic resistor 14 the amplifier 8 is provided with a positive feedback from the output of the second inverter 10 to the input of the first inverter 9 until close to the start of the oscillations (or until an oscillation is produced). This positive feedback produces trigger behavior and interfering oscillations during switching of the inverters are avoided. Moreover, due to resistor 14 the passage of the critical threshold phase—when the inverter flips from its one position to the other—is accelerated considerably. This is a particular advantage at low frequencies of the signals to be amplified, while at high frequencies a relatively steep edge is already provided by the actuation.

It will be understood that the above description of the present invention is susceptible to various modifications, changes and adaptations, and the same are intended to be comprehended within the meaning and range of equivalents of the appended claims.

What is claimed is:

1. In a circuit arrangement for digitally indicating the frequency to which a radio receiver having both an AM tuning oscillator and an FM tuning oscillator is tuned, said circuit arrangement including means for coupling the output signals from said AM and FM oscillators to the input of a common broadband amplifier which has a bandwidth sufficiently broad so as to pass and amplify signal frequencies from both the AM and FM tuning oscillators and which converts the amplified output signals from said oscillators into rectangular signals, said coupling means sufficiently loosely coupling the output signals from said AM and said FM tuning oscillators to the common input of said broadband amplifier so that said tuning oscillators are not noticeably detuned by changes in capacitance of said broadband amplifier, and digital counting and indicating means for counting the frequency of said rectangular signals and for providing a digital indication of the frequency to which the particular tuning oscillator is tuned; the improvement wherein said common broadband amplifier comprises first and second inverters, each having a fast rise-time, which are each designed as an integrated circuit and which are connected in series with one another via a capacitance; and means for applying a respective bias voltage to the input of each of said inverters so that the operating point of each of said inverters lies on the steep portion of the curve indicating the relationship between the input voltage and the output voltage of the inverter, said means for applying a respective bias voltage including a resistive voltage divider connected from the output of said second inverter to a point of reference potential with said voltage divider having its tap connected with said input of said second inverter, which is connected behind said first inverter, to generate the biasing voltage for said second inverter.

2. A circuit arrangement as defined in claim 1 wherein each of said inverters is a Schottky inverter.

3. A circuit arrangement as defined in claim 1 wherein said means for applying a respective bias voltage further includes an ohmic resistor connected between the output and said input of said first inverter to generate the bias voltage for said first inverter.

4. A circuit arrangement as defined in claim 3 further comprising an ohmic resistor connected between said output of said second inverter and said input of said first inverter for producing a positive feedback.

5. A circuit arrangement as defined in claim 1 further comprising an ohmic resistor connected between the output of said second inverter and said input of said first inverter for producing a positive feedback.

6. A circuit arrangement as defined in claim 1 further comprising a high frequency amplifier stage by means of which the output signals from said tuning oscillators are fed to said input of said first inverter.

7. A circuit arrangement as defined in claim 1 further comprising a third inverter designed as integrated circuit connected behind the series connection of said first and second inverters in order to improve signal shaping.

8. A circuit arrangement as defined in claim 1 wherein each of said inverters is a digital inverter comprising a threshold amplifier with phase reversal.

9. A broadband amplifier capable of amplifying signals in the frequency range of both the AM and the FM tuning oscillators of an AM/FM radio and of converting the signals to rectangular signals of the same frequency comprising in combination: first and second digital inverter circuits, each having a fast rise time, which are each designed as an integrated circuit and which are connected in series with one another via a capacitance; and means for applying a respective bias voltage to the input of each of said inverters so that the operating point of each of said inverters lies on the steep portion of the curve indicating the relationship between the input voltage and the output voltage of the inverter, said means for applying a respective bias voltage including a resistive voltage divider connected from the output of said second inverter to a point of reference potential with said voltage divider having its tap connected with said input of said second inverter, which is connected behind said first inverter, to generate the biasing voltage for said second inverter.

* * * * *